(12) United States Patent
Abramovici

(10) Patent No.: US 7,493,434 B1
(45) Date of Patent: Feb. 17, 2009

(54) DETERMINING THE VALUE OF INTERNAL SIGNALS IN A MALFUNCTIONING INTEGRATED CIRCUIT

(75) Inventor: Miron Abramovici, Berkeley Heights, NJ (US)

(73) Assignee: DAFCA, Inc., Framingham, MA (US)

( * ) Notice: Subject to any disclaimer, the term of this patent is extended or adjusted under 35 U.S.C. 154(b) by 70 days.

(21) Appl. No.: 11/136,993

(22) Filed: May 25, 2005

(51) Int. Cl.
*G06F 13/362* (2006.01)
*G01R 31/28* (2006.01)
*G06F 17/50* (2006.01)
*H03L 7/06* (2006.01)

(52) U.S. Cl. .......................... 710/118; 327/157; 716/4; 716/16; 716/17

(58) Field of Classification Search ................ 710/118; 714/726, 736; 716/4, 17, 16; 327/157; 702/65
See application file for complete search history.

(56) References Cited

U.S. PATENT DOCUMENTS

| | | | | |
|---|---|---|---|---|
| 5,311,486 A * | 5/1994 | Alton et al. | ................... | 368/10 |
| 5,450,414 A * | 9/1995 | Lin | ............................. | 714/726 |
| 5,606,564 A * | 2/1997 | Ho et al. | ...................... | 714/724 |
| 5,812,561 A * | 9/1998 | Giles et al. | .................... | 714/726 |
| 5,889,788 A * | 3/1999 | Pressly et al. | ............... | 714/726 |
| 5,918,198 A * | 6/1999 | Ricca et al. | ................. | 702/110 |
| 6,035,110 A * | 3/2000 | Puri et al. | ....................... | 716/6 |
| 6,252,417 B1 * | 6/2001 | Adams et al. | ................. | 326/16 |
| 6,321,354 B1 * | 11/2001 | Prunier | ....................... | 714/726 |
| 6,389,565 B2 * | 5/2002 | Ryan et al. | ................... | 714/724 |
| 6,651,202 B1 * | 11/2003 | Phan | .......................... | 714/733 |
| 6,687,863 B1 * | 2/2004 | Inoue | ......................... | 714/723 |
| 6,687,867 B2 * | 2/2004 | Ni | ............................... | 714/738 |
| 6,754,862 B1 * | 6/2004 | Hoyer et al. | ................. | 714/725 |
| 6,772,369 B2 * | 8/2004 | Smith et al. | ................... | 714/31 |
| 6,877,122 B2 * | 4/2005 | Whetsel | ....................... | 714/727 |
| 6,946,863 B1 * | 9/2005 | Loughmiller et al. | ....... | 324/765 |
| 6,964,001 B2 * | 11/2005 | Dervisoglu et al. | ......... | 714/726 |
| 6,996,750 B2 * | 2/2006 | Tetreault | ...................... | 714/44 |
| 7,047,464 B2 * | 5/2006 | Bailis et al. | ................. | 714/725 |
| 7,055,117 B2 * | 5/2006 | Yee | ............................... | 716/4 |
| 7,080,300 B1 * | 7/2006 | Herron et al. | ............... | 714/726 |
| 7,111,199 B2 * | 9/2006 | Leung et al. | .................. | 714/30 |
| 7,308,564 B1 * | 12/2007 | Jenkins, IV | ................. | 712/227 |
| 2005/0066298 A1 * | 3/2005 | Visweswariah | ................ | 716/6 |
| 2005/0193254 A1 * | 9/2005 | Yee | ............................... | 714/30 |
| 2006/0136852 A1 * | 6/2006 | Bourgin | ........................ | 716/6 |

* cited by examiner

*Primary Examiner*—Khanh Dang
*Assistant Examiner*—Christopher A Daley
(74) *Attorney, Agent, or Firm*—Henry Brendzel

(57) ABSTRACT

A method that enables testing any point (target point) within a core, including a point within a combinatorial circuit of a core, permits testing of points that are not otherwise unobservable in normal debugging processes. Such a target point is tested by identifying a fanout cone from that point to observable outputs, and by performing one or more tests, where each test sensitizes one or more paths that extend the signal of the target point, or its complement, to one or more of the observable outputs, and ascertains the values at those observable outputs. By having more than one observable output at which the signal of target point (or its complement) is tested significantly increases the level of confidence in the test when the observable points concur in the signal value of the target point.

12 Claims, 3 Drawing Sheets

DETERMINING THE VALUE OF INTERNAL SIGNALS IN A MALFUNCTIONING INTEGRATED CIRCUIT

RELATED APPLICATION

This application is related to U.S. patent application Ser. Nos. 10/425,101, filed Apr. 28, 2004, 10/956,854, filed Oct. 1, 2004, 11/051,774, filed Feb. 4, 2005, and 11/120,041, filed May 2, 2005, which are incorporated by reference herein.

BACKGROUND

This invention relates to functional testing and debugging of integrated circuits (ICs), and in particular testing and debugging of systems-on-chip (SoCs) that include blocks of previously verified logic, referred to as cores.

Determining the value of an internal signal in an IC is a fundamental problem in debugging a malfunctioning circuit when one is trying to find the root cause of its misbehavior. Of course, this problem is relevant only for signals that are not part of the circuit's state, because the values of signals that are part of the circuit's state can be easily determined by scanning out the state registers. That's because in modern ICs, all registers can be configured as shift registers, whose contents can be set by a scan-in operation, and can be read by a scan-out operation.

A useful technique for checking the design of ICs is called assertion checking. In assertion checking, a collection of conditions is identified that are expected to hold true at any time during the operation of a properly working SoC. The model of the SoC being tested can be simulated by application of various input test vectors, and its signals can be then checked against the collection of assertions. In a simulation, the signals checked by an assertion may include any internal signal. When an assertion "fires," indicating that the asserted condition that should be met is not met, simulation can stop and the party performing the testing can attempt to analyze the reason for the assertion's failure.

The aforementioned U.S. patent application Ser. No. 10/425,101 discloses an SoC arrangement where cores of the SoC are encompassed by wrappers, and at least some of the wrappers include a functionally reconfigurable module (FRM). The aforementioned U.S. patent application Ser. No. 10/956,854 discloses use of the FRM in efficient assertion checking of SoCs.

Assertion checking in hardware, in contrast to simulation, is limited to checking only those signals that are made visible to the checking hardware. The set of signals to be checked at run-time is defined during the design of the SoC, and different subsets of this set can be selected at run-time. Such an example can be found in the paper "Silicon Debug: Scan Chains Alone Are Not Enough" by Rootselaar and Vermeulen, *Proceedings of the International Test Conference*, 1999

If assertion checking is done when the functional clocks of the SoC have stopped, then the values stored in flip-flops of the SoC (and thus form a part of—or in part define—the state of the SoC) can be also examined by full-scan dumps. A full-scan dump consists of scanning out all the flip-flop values and then using software to extract the values needed to be examined. A different analysis method is described in the aforementioned Ser. No. 11/051,774, where bit extractors are configured in FRMs to extract the bits required for the assertion checking and make them available to assertion checkers that are also implemented in FRMs. The converse of bit extractors are bit injectors where flip-flops of the SoC are set via a stream of scanned-in bits.

One limitation common to all the methods mentioned above is that values of outputs of combinatorial logic elements within the SoC which are not directly observable by the checking hardware cannot be used for assertion checking. The need to determine the value of such a signal may appear many times during the hardware debugging process, and currently there is no method to determine such a value in a malfunctioning circuit. It is an objective, therefore, to enable checking the signal value of any internal point of an SoC in the course of debugging an SoC.

SUMMARY

The above deficiency is remedied, the objective is achieved, and an advance in the art is realized with a method that enables determining the value of any signal (target signal) in a combinatorial circuit of an SoC, typically of a core, that is otherwise unobservable. Such a target signal is tested by identifying a fanout cone from that signal to observable outputs, and by performing one or more tests, where each test sensitizes one or more paths that propagate the value of the target signal (or its complement) to one or more of the observable outputs, and ascertains the values at those observable outputs. By having more than one observable output at which the value of target signal (or its complement) is observed significantly increases the level of confidence in the result when the observable points concur in the value of the target signal.

DETAILED DESCRIPTION

Figure 1:
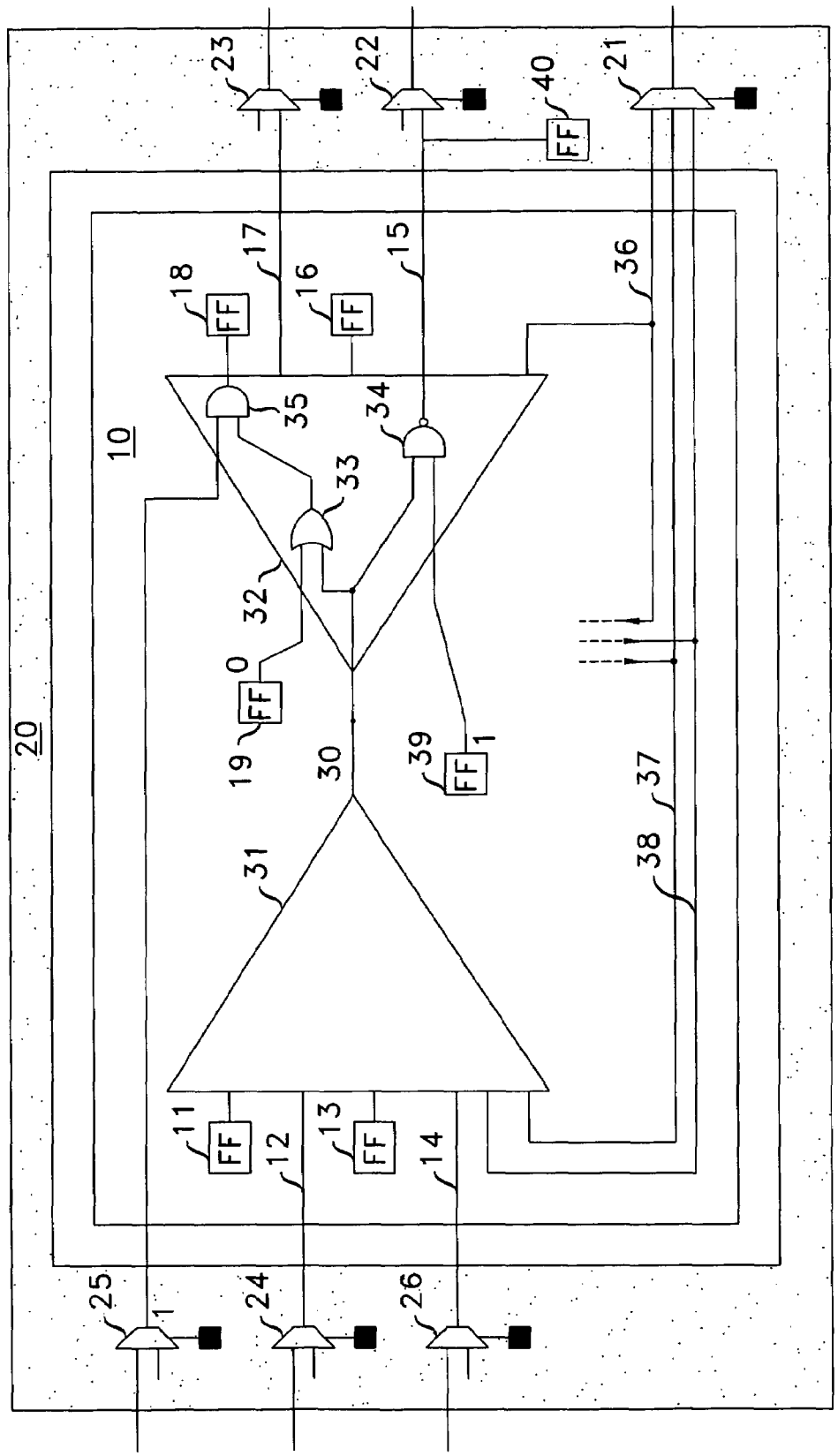
FIG. 1 depicts an arrangement for checking the signal value of a combinatorial circuit within an SoC.

FIG. 1 shows an arrangement that includes core element 10 whose inputs and outputs are connected to wrapper 20. Although for simplicity FIG. 1 shows a wrapper—meaning that all functional inputs and outputs of core 10 pass through the wrapper—that is not a requirement of this invention, except as described below. Signals passing through a wrapper go through "replacement" multiplexers 22, 23, ..., 26. Every such multiplexer either allows the input or the output of the core to go through unchanged, or it replaces that signal with a signal provided by the FRM within wrapper 20. FIG. 1 illustratively also includes internal SoC test points 36, 37, and 38 that are extended to the output of core 10 and attached to multiplexer 21. The multiplexer 21 arrangement enables one to observe the values of the various test points that had been preselected in the design of the SoC and which are thereby selectable by multiplexer 21 at run-time. Such values can also be used as inputs to assertions implemented in wrapper 20. For simplicity, FIG. 1 does not show how the output of the multiplexer 21 is actually observed; for example, it may be further routed to an output port of the SoC, or its value may be captured in a flip-flop residing in wrapper 20, from where it may be scanned out. Absent the methods described below, however, this arrangement is unable to determine the value of internal signals within the SoC, such as the signal 30, which is the output of some combinatorial circuit 31.

Given a signal 30, a combinatorial circuit 31 can always be found with inputs that are observable. Thus, the set of possible inputs to circuit 31 includes outputs of internal flip-flops, such as inputs 11 and 13, functional inputs of the core that arrive from wrapper 20, such as inputs 12 and 14, and outputs from other (combinatorial) circuits within the SoC that also happen to have been extended to multiplexer 21 (signals 37 and 38). In connection with the specific example of FIG. 1, it might be convenient to express the above by the equation $$S_{30}=F_B(S_{11}, S_{12}, S_{13}, S_{14}, S_{37}, S_{38})$$

where $S_i$ stands for the value of signal i, and $F_B$ stands for "Boolean function."

Given a signal 30, a combinatorial circuit 32 can always be found with outputs that are observable. Thus, the set of possible outputs of circuit 32 includes inputs of internal SoC flip-flops, such as flip-flops 16 and 18, functional outputs of the core 10 that are applied to wrapper 20, such as outputs 15 and 17, and test points that had been extended to multiplexer 21, such as output 36. All are observable output signals, as flip-flops 16 and 18 can be scanned out, signals 15 and 17 can be captured in flip-flops residing in wrapper 20, from where they can also be scanned out, and signal 36 is observable via multiplexer 21.

If the debugging of the SoC is performed on a tester, then the primary inputs and primary outputs of the SoC are visible to the tester. However, if the SoC is debugged while it is operating in a system, its primary inputs and outputs are connected to other devices and are not directly observable for debug. But most integrated circuits today are designed in accordance to the IEEE standard 1149.1, described in "Standard Test Access Port and Boundary-Scan Architecture," IEEE Standard 1149.1-1990, May 1990. The standard specifies that every chip has a boundary-scan register, which can capture the values of the pins of the chip, and this register can be scanned out to make these values observable.

Circuitry 31 is sometimes referred to as the "fanin cone" of signals that can affect the value of signal 30, and circuitry 32 is sometimes referred to as the "fanout cone" of signals that signal 30 might affect. To reiterate, all inputs of a fanin cone and all outputs of a fanout cone are observable, and in a synchronous circuit where all state flip-flops are part of scan chains, for any internal signal such as 30 one can always determine a fanin cone bound by flip-flops and primary inputs, and a fanout cone bound by flip-flops and primary outputs To review, it is an objective herein to enable determining the value of any internal target signal of an SoC, such as 30, in the course of debugging an SoC. This is accomplished by stopping the SoC functional clocks when the signal value of the target point is to be observed and proceeding with one or more tests, where each test sensitizes one or more paths that propagate the value of the target signal to one or more of the observable outputs and ascertains the values at those observable outputs. Path sensitization is described, for example, in "Digital Systems Testing and Testable Design" by Abramovici, Breuer, and Friedman, *IEEE Press*, 1990. The result of the one or more experiments is either a determination of the target signal value, or a determination that an error condition exists in the fanout cone, or both.

For example, in FIG. 1 a sensitized path for $S_{30}$ can be created by setting the output of flip-flop 19 to "0" and the output of the replacement multiplexer 25 to "1" (as illustrated in FIG. 1), thus causing the outputs of gates 33 and 35 to be $S_{30}$. This value can be captured in flip-flop 18 and the state of this flip-flop can be scanned out. A different sensitized path can be concurrently created by setting the output of flip-flop 39 to "1" (also illustrated in FIG. 1), thus causing the output of gate 34 (signal 15) to be $\overline{S}_{30}$. This value can be captured in a flip-flop in wrapper 20, such as flip-flop 40, and the state of this flip-flop can be scanned out. Whereas the two sensitized paths mentioned above can be established concurrently, effectively in one test, a skilled artisan will readily realize that in some cases this may not be possible, and two or more different tests/experiments may be needed to sensitize different paths. Use of a plurality of paths is necessary in order to make sure that the observable output truly reflects the target signal value, rather than a value dictated by a malfunctioning fanout cone element. Thus, if we obtain $S_{18}=1$ and $S_{15}=0$, these results are in agreement with each other, because both imply $S_{30}=1$, and we can conclude with a fairly high level of confidence that the actual value of signal 30 is "1", because an error that would affect propagation on the two disjoint paths is quite unlikely. Obviously, the more outputs of circuit 32 that can be made to reflect the value $S_{30}$, and the more disjoint the sensitized paths, the greater is the level of confidence in the above conclusion. If, on the other hand, we obtain $S_{18}=S_{15}=1$, then it is known that an error exists in fanout cone 32 (regardless of whether $S_{30}$ is correct), because in a correctly operating circuit the values $S_{18}$ and $S_{15}$ must be complementary. Knowing the expected value of signal 30 (say "0"), we can determine which one of the output values is likely to be the incorrect one (assuming that the circuit does not suffer from two errors that mask the situation). In this example, $S_{15}=1$ agrees with the expected value of the target signal, so we can conclude the error affects propagation along the path through gates 33 and 35 and flip-flop 18.

In general, for a sensitized path from i to j, the relation between the values of the two signals is given by $$S_j = S_i \oplus inv_{ij}$$

where $inv_{ij}$ is the inversion parity of the sensitized path (1 if the number of inversions between i and j is odd, and 0 otherwise). To illustrate, in FIG. 1, the path from 30 to 15 has one inversion ($inv_{ij}=1$), while the path from 30 to 18 has no inversions ($inv_{ij}=0$).

Flip-flop values needed for path sensitization can be obtained by scanning them in or by the method described in the aforementioned Ser. No. 11/051,774, where bit injectors are configured in FRMs to inject the required values.

Figure 2:
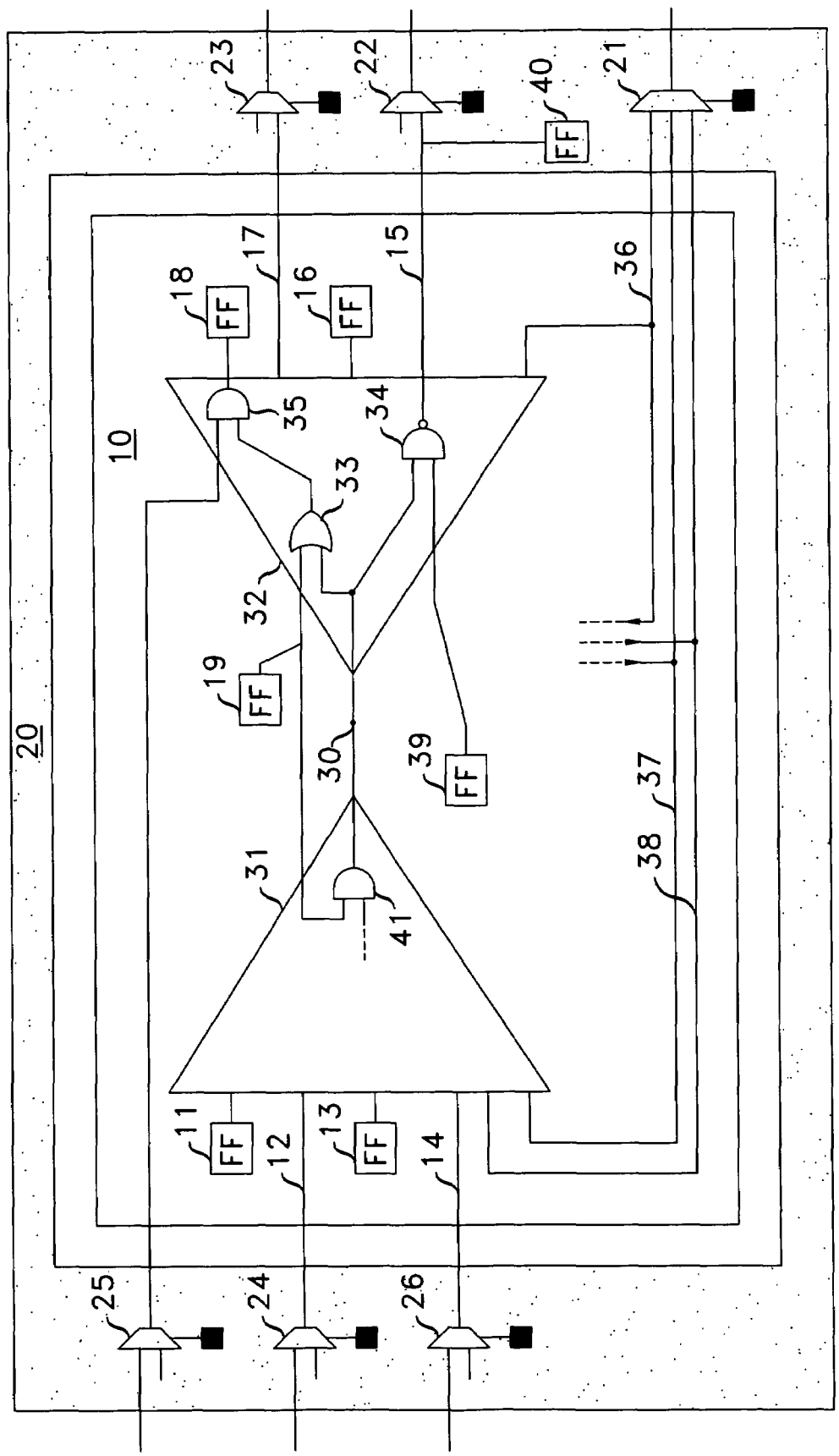
FIG. 2 illustrates the need to be careful about sensitizing paths so as not to change the value of the target signal.

Of course, any value assigned to sensitize a path should not modify the value of the target signal. For example, flip-flop 19 in FIG. 2 affects both $S_{30}$ (via AND gate 41) and the fanout cone of $S_{30}$. If $S_{30}$ is currently "1", trying to sensitize the path from signal 30 to flip-flop 18 requires changing flip-flop 19 from "1" to "0", but this changes the value $S_{30}$ to "0." However, it is always possible to find at least one combination of values that will propagate the value of the target signal without changing it, provided that both the stuck-at-0 and the stuck-at-1 faults on the target signal are detectable in the given circuit.

It is important to make sure that the scan chains and the wrappers are correctly functioning before running any experiment that relies on their operation to set and observe values in the circuit.

Figure 3:
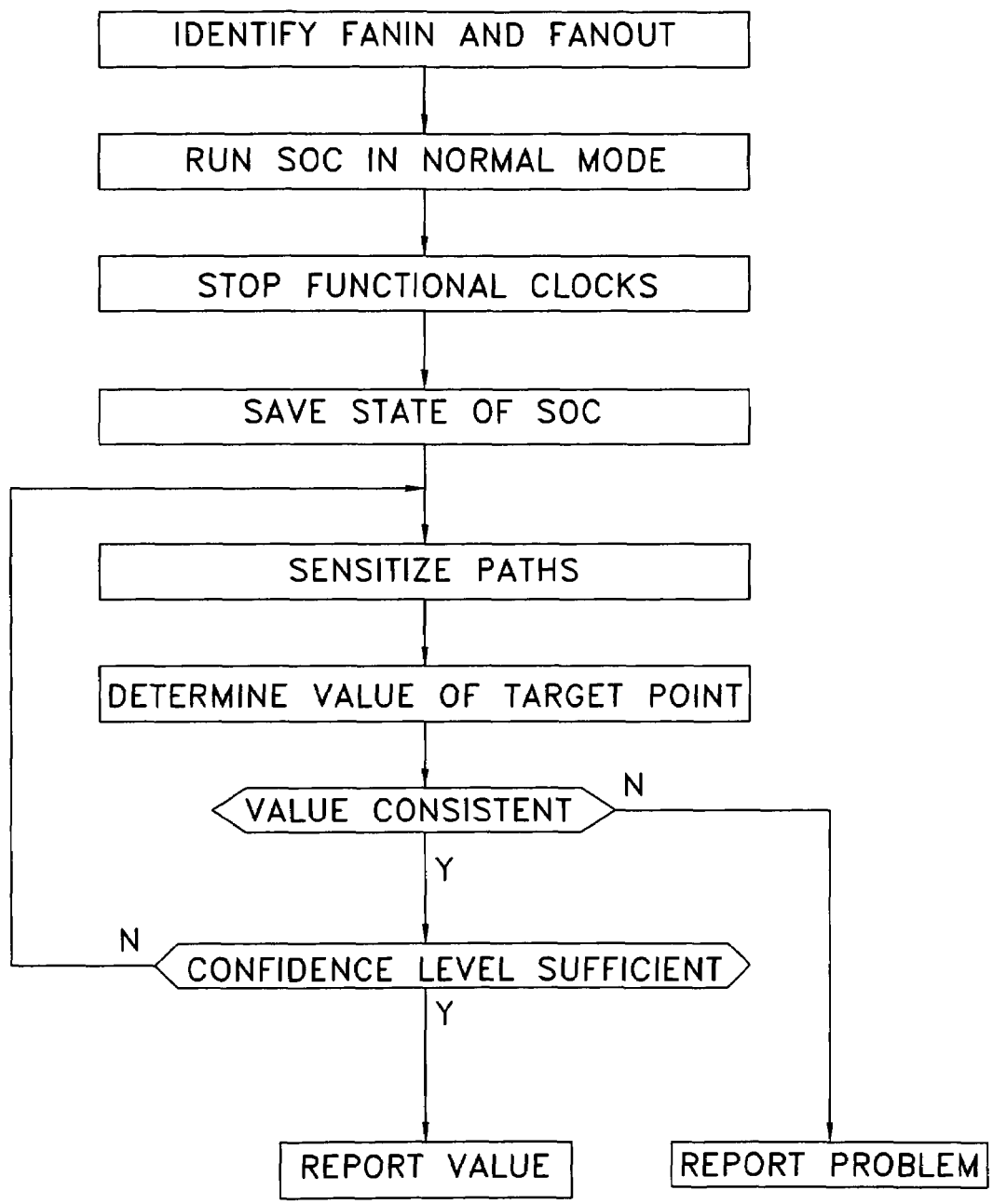
FIG. 3 is a flowchart of the method disclosed herein.

The procedure to determine the value of an internal, otherwise unobservable, signal of an SoC is shown in FIG. 3 and may be summarized as follows (though not all of the steps are essential to the invention per se):

1. (Preparation) Verify the operation of the scan chains and of the wrappers (not shown in FIG. 3).
2. (Preparation) Identify a target signal and its fanin and fanout cones.
3. Run the circuit in its normal mode of operation.
4. Stop the functional clocks at a selected time (for example, when an assertion has fired, or after the operation lasted a user-specified number of clock cycles, etc.).
5. Save the state of the SoC by scanning out registers.
6. Sensitize a path or paths from the target signal to outputs of its fanout cone, thereby forming a set of relevant observable outputs, without changing the value of the target signal, and configure a processing module in the FRM for making determinations regarding the values obtained at the one or more observable outputs where the target signal value or its complement is to appear. Set the values needed for sensitization as follows:

a. For SoC flip-flops, scan-in their required values or, use bit injectors configured in the FRM.
b. For primary inputs of the SoC, scan-in their required value in their corresponding boundary-scan flip-flops.
c. For inputs of the fanout cone traversing a wrapper, generate their required values in the wrapper and configure their corresponding replacement multiplexers to apply the generated values to the fanout cone inputs.

7. Collect and analyze the values of the relevant observable outputs
a. For SoC flip-flops, scan-out their captured values or, use bit extractors configured in the FRM.
b. For primary outputs of the SoC, capture their values in their corresponding boundary-scan flip-flops, and scan-out their captured values.
c. For outputs of the fanout cone traversing a wrapper, capture their values in the flip-flops residing in wrappers and scan them out, or use bit extractors configured in wrappers.

8. Determine the values of the target signal based on the observed value and the inversion parity of the sensitized paths. Advantageously, the determining is performed in a processing module configured within the FRM (in step 6).

9. Check whether the determined values are consistent with each other and with a previously determined value. Advantageously, this is performed within the FRM.

10. If not, report a problem.

11. Otherwise, determine whether the desired level of confidence was reached.

12. If not, store the value of target signal in a Previous Value (PV) flip-flop of the FRM and return to step 6 so that different path, or paths, can be sensitized.

13. Otherwise, report the determined value.

14. Restore the state of the SoC by scanning in the state saved in step 5 and restart the functional clock.

The invention claimed is:

1. A method for determining the value of a target signal at a point of a chip within an integrated circuit comprising the steps of:
    identifying a fanout cone from said point, to outputs of said chip, said point being arbitrary within said integrated circuit, where a fanout cone from said point is a collection of circuit elements of said integrated circuit whose respective states may be affected by a signal at said point, and where this effect is observable at outputs of said integrated circuit;
    sensitizing one or more paths in said fanout cone to cause the value of said target signal, or its inverse, to immediately appear at a set of two or more of said outputs (relevant outputs) without affecting value of said point;
    following said step of sensitizing, determining whether a discrepancy exists between value of said target signal reflected at one of said relevant outputs and value of said target signal reflected at another one of said relevant outputs created by said step of sensitizing or by a previous step of sensitizing;
    when said step of determining concludes that there is a discrepancy, reporting said discrepancy; and
    when said step of determining concludes that there is no discrepancy, reporting signal value of said target signal.

2. The method of claim 1 further comprising, prior to said step of reporting signal value, the steps of:
    determining whether level of confidence in said signal value is higher than a preselected level; and
    returning to said step of sensitizing to sensitize one or more paths not heretofore sensitized, and potentially resulting in a different set of relevant outputs, when the last-mentioned step of determining concludes that the level of confidence is not higher than said preselected level.

3. The method of claim 1 further comprising:
    prior to said step of sensitizing
        operating said integrated circuit with a functional clock,
        stopping said functional clock upon the occurrence of a preset condition, and
        saving state of said integrated circuit; and
    following said step of reporting signal value
        restoring said integrated circuit to said state saved in the step of saving, and
        restarting the stopped functional clock.

4. The method of claim 1 where said integrated circuit comprises a core and a wrapper that includes replacement multiplexers that are controlled via a functionally reconfigurable module (FRM) and at least one of the values required in said step of sensitizing is provided by a multiplexer of said replacement multiplexers.

5. The method of claim 1 where said integrated circuit comprises a core and a wrapper that includes a functionally reconfigurable module (FRM) and where the step of determining comprises configuring a processing unit within said FRM and processing said relevant outputs in said processing unit.

6. The method of claim 5 where those of said relevant outputs that are coupled to flip-flops are captured in the coupled flip-flops and applied to said processing circuit by means of a scan-out process applied to said flip-flops.

7. The method of claim 6 where at least some of those of said relevant outputs are captured in flip-flops of said wrapper and are applied to said processing circuits by means of said scan-out process.

8. The method of claim 7 where said scan-out process employs at least one bit extractor that is configured within the FRM.

9. The method of claim 4 where said integrated circuit includes a plurality of flip-flops and said step of sensitizing comprises scanning-in a preselected value into at least some of said flip-flops.

10. The method of claim 9 where said step of scanning-in employs at least one bit injector that is configured within said FRM.

11. The method of claim 1 where said point is internal to a chip within said integrated circuit.

12. A method that tests correctness of an integrated circuit with an internal chip that has a set of inputs and a set of outputs and comparison circuitry coupled to said set of outputs, where input signals are applied to at least some of said inputs through inputs of said integrated circuit, characterized by:
    selecting an arbitrary signal point within said chip;
    applying signals to said inputs of said chips, through inputs of said integrated circuit, to cause one or more paths to be established from the selected signal point to at least two of said outputs of the chip (relevant outputs) without affecting value of said point, said paths being such that a change in a signal at the selected signal point is immediately reflected in a signal change at each of the relevant outputs;
    determining whether said integrated chip operates correctly by comparing at least two of said relevant outputs to each other; and
    reporting said determination to an observable output of said integrated circuit.

* * * * *